United States Patent [19]
Hashimoto

[11] Patent Number: 5,946,195
[45] Date of Patent: Aug. 31, 1999

[54] SEMICONDUCTOR DEVICE, METHOD OF MAKING THE SAME AND MOUNTING THE SAME, CIRCUIT BOARD AND FLEXIBLE SUBSTRATE

[75] Inventor: Nobuaki Hashimoto, Suwa, Japan

[73] Assignee: Seiko Epson Corporation, Tokyo, Japan

[21] Appl. No.: 09/035,068

[22] Filed: Mar. 5, 1998

[30] Foreign Application Priority Data

Mar. 10, 1997 [JP] Japan ................................. 9-072616

[51] Int. Cl.⁶ .............................. H05K 1/11; H05K 1/14; H01L 23/12
[52] U.S. Cl. ........................ 361/774; 174/260; 174/261; 257/692; 257/668; 257/786; 29/832; 361/749; 361/764; 361/777
[58] Field of Search .............................. 29/827, 829, 832, 29/841, 846, 854; 174/253, 254, 260, 261, 268; 257/668, 672, 676, 688, 690, 692, 695, 700, 723, 724, 735, 736, 773, 786; 349/58, 141, 149, 150, 151, 152; 361/749, 750, 751, 760–764, 772, 774, 776, 777, 790, 803; 438/108, 117, 461, 611, 666; 439/67, 68, 77

[56] References Cited

U.S. PATENT DOCUMENTS

| 5,036,380 | 7/1991 | Chase | 257/668 |
| 5,173,369 | 12/1992 | Katacka | 257/735 |
| 5,345,363 | 9/1994 | Bhattacharyya et al. | 361/749 |
| 5,440,452 | 8/1995 | Kitahara | 361/777 |
| 5,866,941 | 2/1999 | Lacap | 257/690 |

FOREIGN PATENT DOCUMENTS

B2-8-31500 3/1996 Japan .

*Primary Examiner*—Donald Sparks
*Attorney, Agent, or Firm*—Oliff & Berridge, PLC

[57] ABSTRACT

A semiconductor device includes a semiconductor element, an insulating film and a wiring pattern. The insulating film has a first opening and a plurality of second openings. At least part of the semiconductor element is positioned in the first opening when the semiconductor element is disposed on the insulating film. The second openings are provided aligned around the first opening. Each of the second openings has a pair of long edges in an approximately quadrilateral shape. The long edges are positioned at right angles to the closest one of edges defining the first opening. The wiring pattern is formed on a surface of the insulating film and connected to the semiconductor element. The wiring pattern has a plurality of connection portions at its extremity. Ones of the connection portions are positioned in each of the second openings. The ones of the connection portions are disposed in a staggered fashion facing toward a center of each of the second openings from the long edges of each of the second openings.

15 Claims, 7 Drawing Sheets

SEMICONDUCTOR DEVICE, METHOD OF MAKING THE SAME AND MOUNTING THE SAME, CIRCUIT BOARD AND FLEXIBLE SUBSTRATE

BACKGROUND OF THE INVENTION

1. Field of the Invention

The invention relates to a surface-mounted semiconductor device, a method of manufacturing the same and a method of mounting the same, a circuit board and a flexible substrate with the same mounted thereon, and a method of manufacturing the same.

2. Description of Related Art

To pursue compactness in semiconductor devices, bare chip mounting is the ideal, but since in this case quality control and handling are difficult, the need is met by processing as packages. As such packages, in response to the requirements of finer pitch between the pads of the semiconductor chip by the adoption of fine pitch mounting and more compactness, and also the call for efficiency in volume production, there are TCP (tape carrier package) units using TAB (tape automated bonding). Conventionally a TCP has the locations required for TAB covered with resin to form a completed package. Conventional TAB has, as for example shown in Japanese Patent Publication No. 8-31500, in FIG. 7, outer leads passing through outer lead holes. The outer leads of a TCP using this TAB has the outer leads projecting in a row at a fixed spacing from the side surfaces of the package. If this form is maintained while attempting to reduce the size of the package as much as possible, and meanwhile an attempt is made to increase the number of leads, then it becomes necessary to reduce the lead width, and also the spacing between adjacent leads. However, with this means there are limits on the arrangement of wiring, and it is necessary to find a different means of further increasing the degree of freedom.

Moreover, even if the degree of freedom is increased, it has been necessary to easily carry out bonding of the outer leads to the circuit substrate.

A TCP using conventional TAB in this way has thus presented problems including problems in relation to freedom of wiring layout and problems in relation to the ease of bonding.

SUMMARY OF THE INVENTION

The object of the invention is to allow easy mounting to provide a surface-mounted semiconductor device, a method of manufacturing the same and a method of mounting the same, a circuit board and a flexible substrate with the same mounted thereon, and a method of manufacturing the same.

The semiconductor device of the invention has a semiconductor element, an insulating film and a wiring pattern. The insulating film has a first opening and a plurality of second openings. At least part of the semiconductor element is positioned in the first opening when the insulating film is disposed on the semiconductor element. The second openings are aligned around the periphery of the first opening. The wiring pattern is formed on one surface of the insulating film and connected to the semiconductor element, having a plurality of connection portions at its extremity. The connection portions are positioned in the second openings. The second openings have a pair of long edges and are formed in an approximately quadrilateral shape. The long edges are positioned at right angles to the closest one of edges defining the first opening. The connection portions are disposed in a staggered fashion facing toward the center from both sides of the pair of long edges.

According to the invention, since the second openings have a pair of long edges and are formed in an approximately quadrilateral shape, and the pair of long edges are positioned at right angles to the closest one of edges defining the first opening, it is possible to provide a large number of the second openings at the area corresponding to one side of the first opening. Moreover, since it is possible to provide a large number of the second openings, it also becomes concomitantly possible to provide a large number of the connection portions. Furthermore, since within the second openings the connection portions are disposed in a staggered fashion facing toward the center from both sides of the pair of long edges, an adequate spacing between the connection portions can be ensured. Moreover, the connection portions can be provided on the underside of the semiconductor device (within the mounting area of the semiconductor device), improving the flexibility afforded to design. It should be noted that in order to provide the connection portions facing toward the center from both sides of the pair of long edges, it is necessary to lead out the wiring pattern using the film portion between the second openings. At this time, in order for the connection portions of the second openings to be arranged in a staggered fashion, it is preferable for the wiring pattern to be separated and led along both sides of the insulating film forming the pair of long edges. In particular, since the wiring pattern surrounding a single one of the second openings can be spread out, the wiring pitch can be made coarser (wider), and the additional benefit of removing obstacles to the fabrication of the tape is obtained.

In the above-described semiconductor device, the extremity of the wiring pattern may be bent in a direction away from the surface of the insulating film, and the connection portions may be positioned separated from the insulating film within the second openings.

By this means, the connection portions project from the insulating film, facilitating mounting on the circuit board. That is to say, since the connection portions project from the insulating film, when the semiconductor device is mounted on the substrate being the object to which it is connected, a fixed distance between the insulating film and the substrate can be obtained, and an insulated state can be formed, whereby precise design of both conducting and insulated regions becomes no longer necessary. Moreover, since bending of the insulating film which would otherwise occur can be absorbed by these projecting connection portions, this is extremely beneficial when the insulating film is being flattened.

The flexible substrate of the invention has an insulating film having a first opening such that when connected to a semiconductor element at least part of the semiconductor element is positioned therein, a plurality of second openings provided aligned around the first opening, and a wiring pattern formed on one surface of the insulating film and connected to the semiconductor element, having at an extremity connection portions positioned in the second openings. The second openings have a pair of long edges and are formed in an approximately quadrilateral shape, and the pair of long edges are positioned at right angles to the closest one of edges defining the first opening. The connection portions are disposed in a staggered fashion facing toward the center from both sides of the pair of long edges.

Here, a pair of the connection portions mutually opposed within the second opening may be provided in positions symmetrical with respect to a phantom line parallel to a shorter edge of the second opening.

By this means, since the connection portions are arranged in a staggered fashion, within a particular second opening, one connection portion can be made larger (longer). Again, the second opening can, compared with the case in which the connection portions are completely opposing, be made smaller. For example, even in a narrowed-pitch situation a gap can be obtained between connection portions provided from the opposing long edges.

The connection portions preferably become narrower in the direction toward the center of the second opening from the surface of the insulating film.

By this means, since the connection portions are finer within the second opening, the spacing between adjacent connection portions can be made narrower, and as a result, a large number of connection portions can be provided.

Again, it is preferable for the wiring pattern to have a test pad formed close to one the second openings and electrically conducted to one of the connection portions.

By thus forming a test pad close to one of the second openings, the connection portions can be formed adjacent to the test pad, and the area for soldering in the connection portions can be increased.

The length of the long edges of the second openings is preferably determined according to the positioning for avoiding the wiring pattern.

In particular, the length of the long edges of the second openings preferably becomes shorter moving in the direction of disposition of the second openings from the center to the extremities, becoming shorter at a side of the first opening.

By this means, since it is possible to form the second openings while avoiding all wires to the connection portions, high density wiring is possible, and application is possible to integrated circuits with a higher pin count.

Again, it is preferable for the length of the short edges of the second openings to be shorter than the spacing between adjacent second openings.

By this means, it is possible to form a large number of wires between adjacent second openings.

Furthermore, there is preferably a link portion linking all of the connection portions positioned in whichever second opening, to cause an electrical connection within this second opening.

If by this means the connection portions are linked and made electrically connected, inexpensive electroplating can be carried out simply.

The circuit board of the invention has the semiconductor device, and a substrate with a desired conducting pattern formed thereon. The connection portions of the semiconductor device are connected to the conducting pattern.

The method of manufacturing a semiconductor device of the invention includes a step of forming a first opening and a plurality of second openings in an insulating film. The first opening is positioned such that in the state of connection to the semiconductor element at least part of the semiconductor element is positioned therein. The second openings are provided so as to be arranged around the first opening. The method also includes a stop of forming in one surface of the insulating film a wiring pattern having connection portions at an extremity positioned in the second openings. The wiring pattern is to be connected to the semiconductor element and formed on one surface of the insulating film. The method also includes a step of connecting the semiconductor element to the wiring pattern and a step of mounting the same on the insulating film. The second openings have a pair of long edges and are formed in an approximately quadrilateral shape. The pair of long edges are positioned at right angles to the closest one of edges forming the first opening. The connection portions are disposed in a staggered fashion facing toward the center from both sides of the pair of long edges.

With a semiconductor device manufactured by this method, while observing the second openings, it Is possible to align the connection portions with pads formed on the circuit board.

The method of manufacturing a flexible substrate of the invention includes a step of forming in an insulating film a first opening positioned such that in the state of connection to the semiconductor element at least part of the semiconductor element is positioned therein and a plurality of second openings provided so as to be arranged around the periphery of the first opening. The method also includes a step of forming on one surface of the insulating film a wiring pattern having connection portions at an extremity positioned at the second openings, and connecting to the semiconductor element, and formed on one surface of the insulating film. The second openings have a pair of long edges and are formed in an approximately quadrilateral shape. The pair of long edges are positioned at right angles to the closest one of edges forming the first opening. The connection portions are disposed in a staggered fashion facing toward the center from both sides of the pair of long edges.

Here, there may also be included a stop whereby within each of the second openings all of the connection portions are provisionally formed electrically connected by a link portion, after which the link portion is cut away and removed. It should be noted that the link portion is formed for the purpose of electroplating or the like.

The method of mounting a semiconductor of the invention includes a step of forming a conducting pattern on a circuit board, a step of providing solder on the conducting pattern, and a step of connecting the connection portions of the semiconductor device to the conducting pattern by means of the solder previously provided to the conducting pattern.

BRIEF DESCRIPTION OF THE DRAWINGS

The invention will be described in detail with reference to the following drawings, wherein.

DETAILED DESCRIPTION OF THE PREFERRED EMBODIMENTS

Preferred embodiments of the invention are now described with reference to the drawings.

First Embodiment

Firstly the semiconductor device relating to the invention, and the flexible substrate and circuit board are described.

Figure 1:
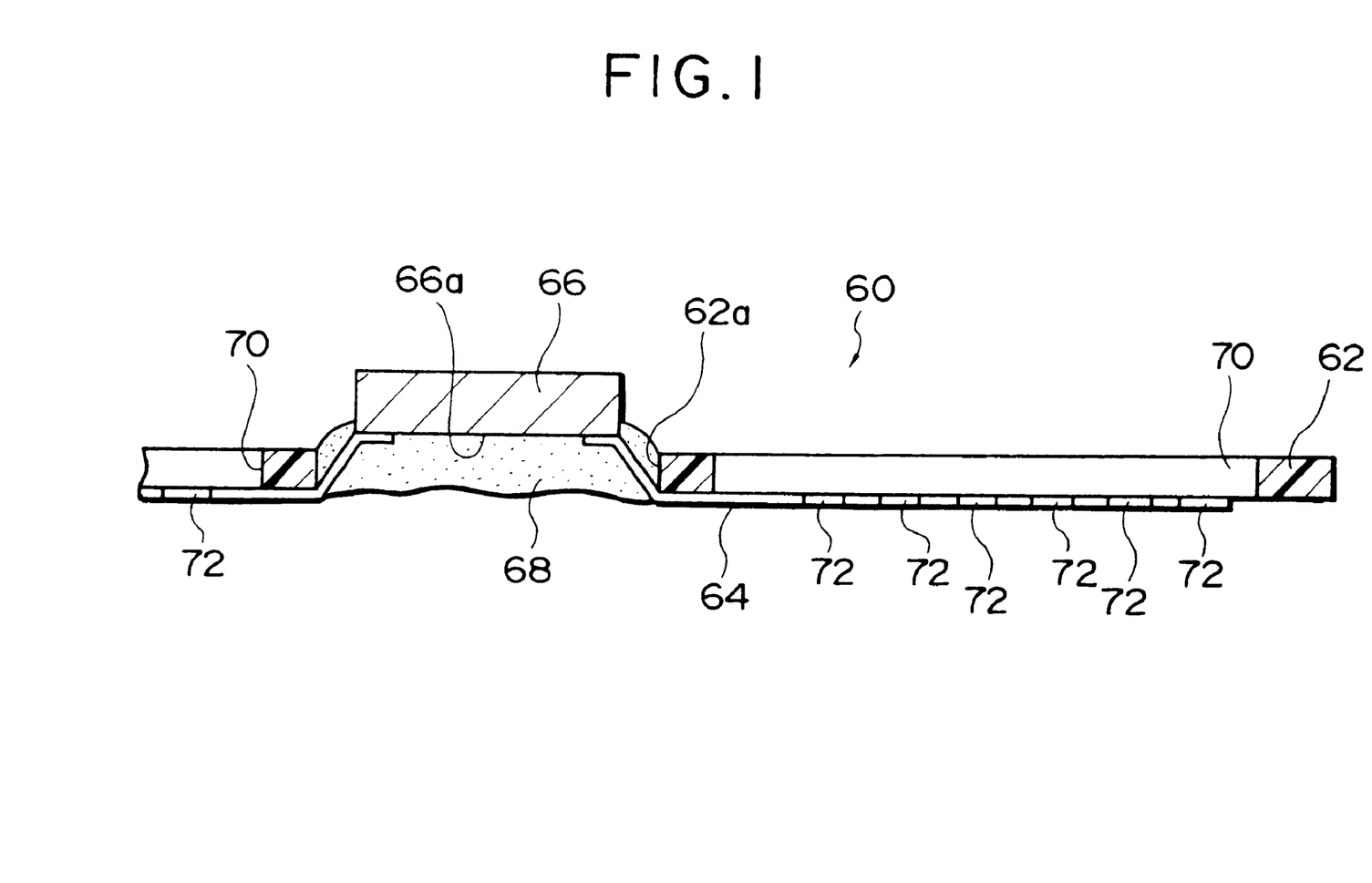
FIG. 1 shows a first embodiment of a semiconductor device.

FIG. 1 shows a first embodiment of the semiconductor device. This semiconductor device 60 has a wiring pattern 64 formed on one surface of an insulating film 62 and a semiconductor chip 66 provided utilizing a device hole (first opening) 62a formed in the insulating film 62. The semiconductor chip 66 is formed of a semiconductor element and is disposed so as to project from the surface of the insulating film 62 opposite to the surface on which the wiring pattern 64 is formed, and moreover is disposed with an active surface 66a facing in the direction of the device hole 62a of the insulating film 62. The extremity of the wiring pattern 64 projects into the device hole 62a, is bent in the direction of the surface opposite to that on which it is formed, and is connected to the semiconductor chip 66. The semiconductor chip 66 and insulating film 62 are sealed by potting with an epoxy resin 68.

The device hole 62a has the whole or at least a part of the semiconductor chip 66 positioned therein. That is to say, there are three types: (1) the case in which as shown in FIG. 1 the whole of the semiconductor chip 66 is positioned within the device hole 62a (normal TAB), (2) the case in which the device hole is smaller than the projection area of the semiconductor chip and the semiconductor chip projects through the device hole while a portion of the semiconductor chip extends outside the opening (that is to say, the extended portion is not positioned within the opening) (slim TAB), and (3) the case in which one extremity of the semiconductor chip extends outside the opening, and the other extremity produces a gap in the opening (variant slim TAB).

The semiconductor device 50 has a plurality of openings (second openings) 70 (hereinafter the otherwise unqualified expression "opening" refers always to these second openings) formed in the insulating film 62, and connection portions 72 provided from the wiring pattern 64 are characterized by being exposed by the openings 70. The openings 70 and connection portions 72 are constructed to facilitate bonding to a circuit board.

The semiconductor device 60 has the connection portions 72 (external terminals) arranged in a grid array, and is a semiconductor device of a surface-mounted grid array type with no solder balls. However, as another example, may be employed the so-called BGA (ball grid array) type of semiconductor device having solder on the connection portions 72 (external is terminals).

Again, the semiconductor chip 66, while facing upward in FIG. 1 (reverse TAB), is not restricted to this, and the semiconductor chip may equally be mounted in the reverse orientation (face-down) (so-called front TAB). In other words, the semiconductor chip may be positioned on the surface of bump formation. In this case, since it is possible for the reverse surface of the semiconductor chip to contact the motherboard, by connecting the semiconductor chip to the motherboard with for example silver paste or similar thermally conducting adhesive, the heat dissipation of the semiconductor chip can be improved. Further, according to the thickness of the semiconductor element, since a fixed height can be obtained between the insulating film and the motherboard, short circuits between for example adjacent solder bumps can be avoided.

Figure 2:
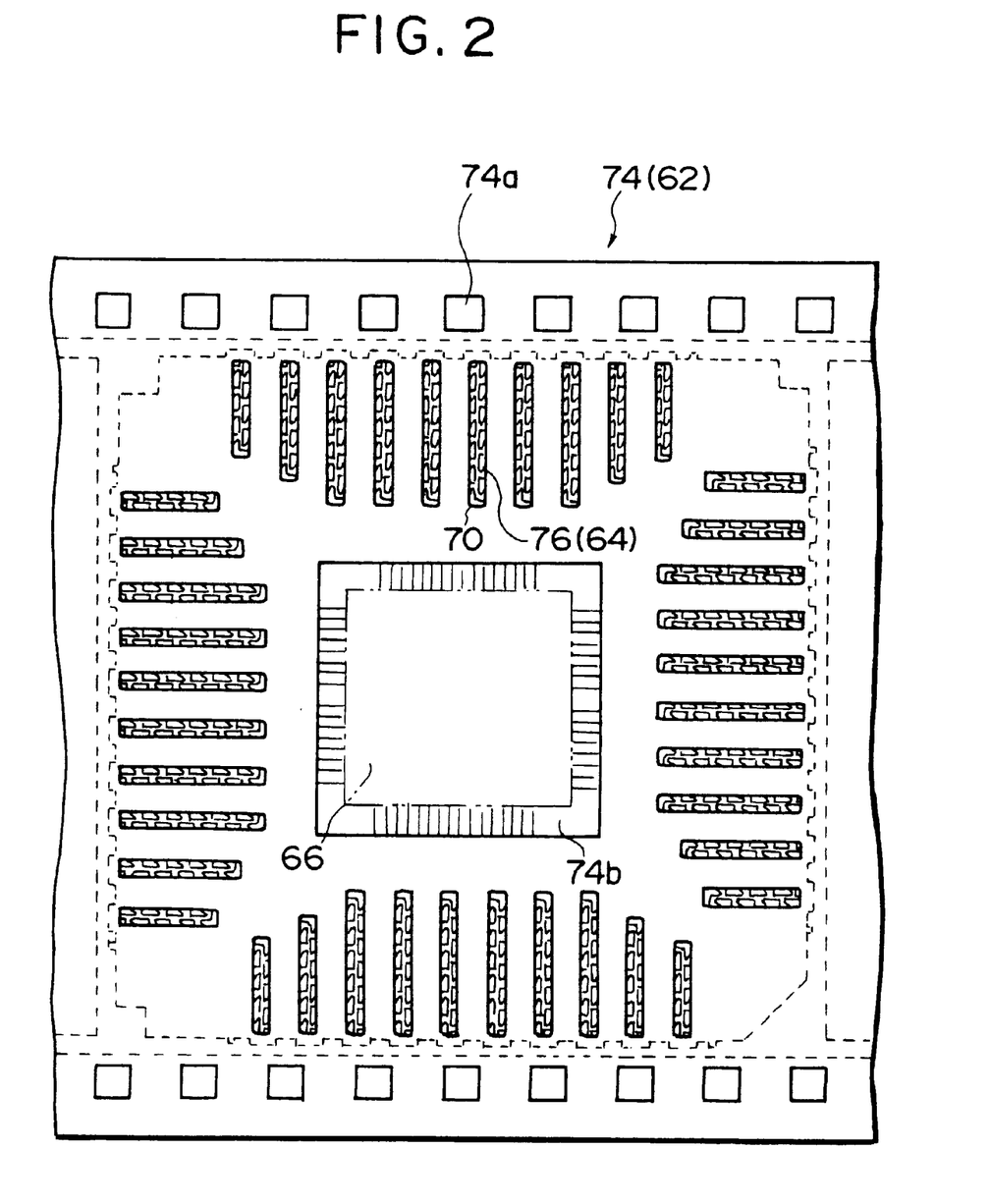
FIG. 2 shows a film carrier tape used in the fabrication of the semiconductor device of the first embodiment.
Figure 3A:
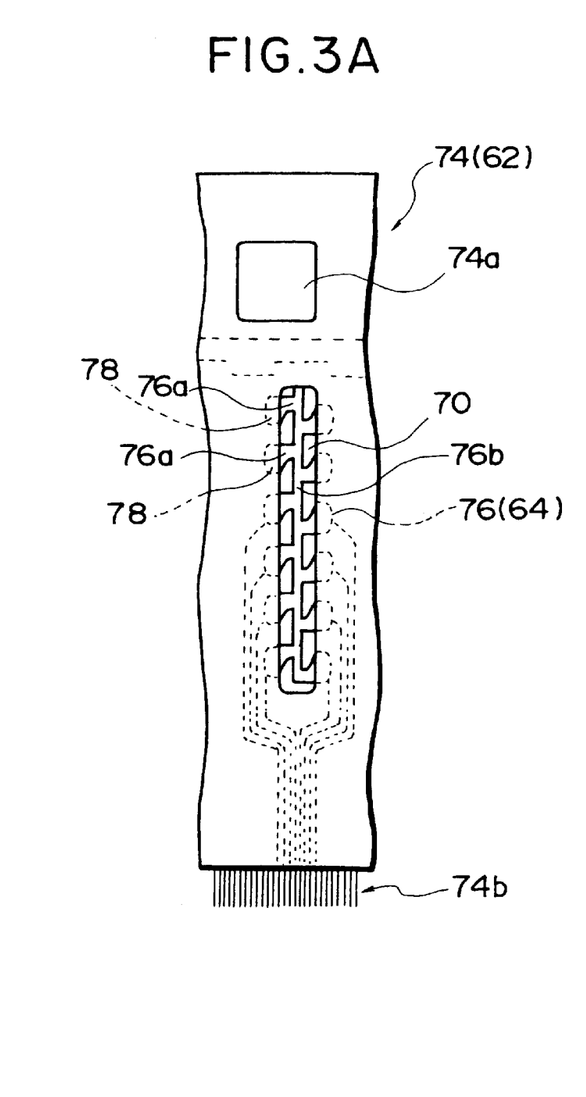
FIGS. 3A and 3B show stages in the processing of the film carrier tape.

FIG. 2 shows a flexible substrate (hereinafter termed "film carrier tape") used in the fabrication of the semiconductor device of the first embodiment, and this flexible substrate is used as a substrate for normal TAB mounting. FIG. 3A is an enlarged view of a part of the film carrier tape. This film carrier tape 74 when separated forms the above-described insulating film 62, and has sprocket holes 74a and a device hole 74b being a first opening (see FIG. 2). The device hole 74b is such that when the semiconductor chip is mounted at least a portion thereof is positioned therein, and is approximately quadrilateral. In this embodiment a square form, having four sides of equal length, is used. The sides of the device hole are provided parallel to the sides forming the film carrier tape 74. It should be noted that the device hole 74b may equally be oblong to match the form of the semiconductor chip.

Within the opening 70 of the film carrier tape 74, a provisional wiring pattern 76 is formed. This provisional wiring pattern 76 has a link portion 76b, connection portions 72, and a wiring pattern 64 formed integrally, and the link portion 76b is formed to extend across the opening 70. Each of the connection portions 72 (wiring pattern 64) is formed in a state integral with the link portion 76b passing across in this way. It should be noted that the each of the connections between connection portions 72 and the link portion 76b is connected in a position such that the distance is short. By means of this provisional wiring pattern 76 all of the connection portions 72 are electrically connected, and have electroplating processing applied. After the electroplating processing, separation is carried out at prescribed locations, to form the above-mentioned wiring pattern 64. It should be noted that the explanation here is of an example in which electroplating processing is required, but in the case in which plating processing is not required, or in which non-electrolytic plating is used, the provisional wiring pattern 76 is not required, and therefore the operation of separation and all related items, such as for example dies, are not required. A part of the wiring pattern 64 projects into the device hole 74b, and can be connected to the semiconductor chip 66 as shown by the double-dotted broken lines in FIG. 2.

Again, the film carrier tape 74 has the above-mentioned openings 70 formed therein. These openings 70 are in the form of slots, and are such that a part of the provisional wiring pattern 76 is exposed. In detail, within an opening 70 a plurality of projections 76a face in-the direction toward the center from the opposing long edges. The projections 76a, moreover, project from the respective long edges to oppose each other in a staggered fashion. In other words, the projections 76a project in a zigzag manner. Again, all of the projections 76a are linked to the link portion 76b in the center of the opening 70.

Figure 3B:
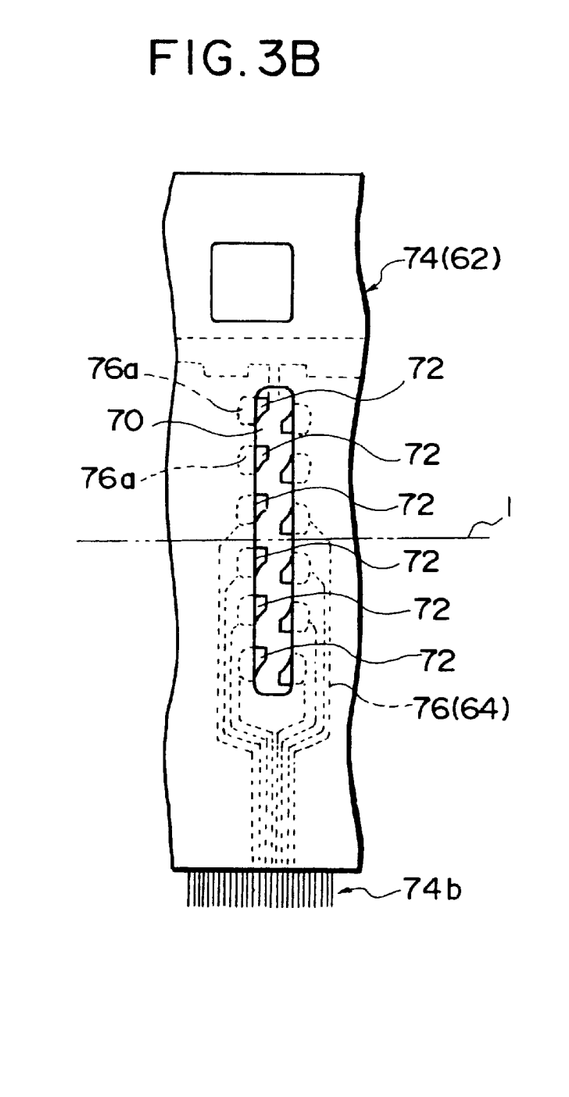

From the provisional wiring pattern 76 thus formed, by cutting away the link portion 76b, as shown in FIG. 3B, a construction is obtained in which the connection portions 72 project from the openings 70. These connection portions 72 indicate the portions of the projections 76a remaining after the link portion 76b has been removed, and are therefore in the same way as the projections 76a, arranged in a staggered or zigzag fashion, projecting toward the center from the long edges of the opposing long edges of the opening 70.

It should be noted that the projections 76a project from pad portions 78 of greater area than other wiring. Specifically, pad portions 78 of greater extent than other wiring are provided, and the projections 76a extend from these pad portions 78. By the provision of the pad portions 78 of greater extent, after the link portion 76b is cut away, the pad portions 78 can be reached with a probe, and testing carried out. Again, while the pad portions 78 can be used for testing, since the pad portions 78 are provided linked in close proximity to the connection portions 72, they can also be used as part of the connection portions. As a result, when the connection to the external circuit board is carried out, the connection material, for example in the case of solder just the amount of solder to form the projections (bumps) can be provided.

To the film carrier tape 74 processed in this way, the semiconductor chip 66 is attached, prescribed locations of the film carrier tape 74 are cut away, and the semiconductor device 60 of FIG. 1 is obtained.

Figure 4:
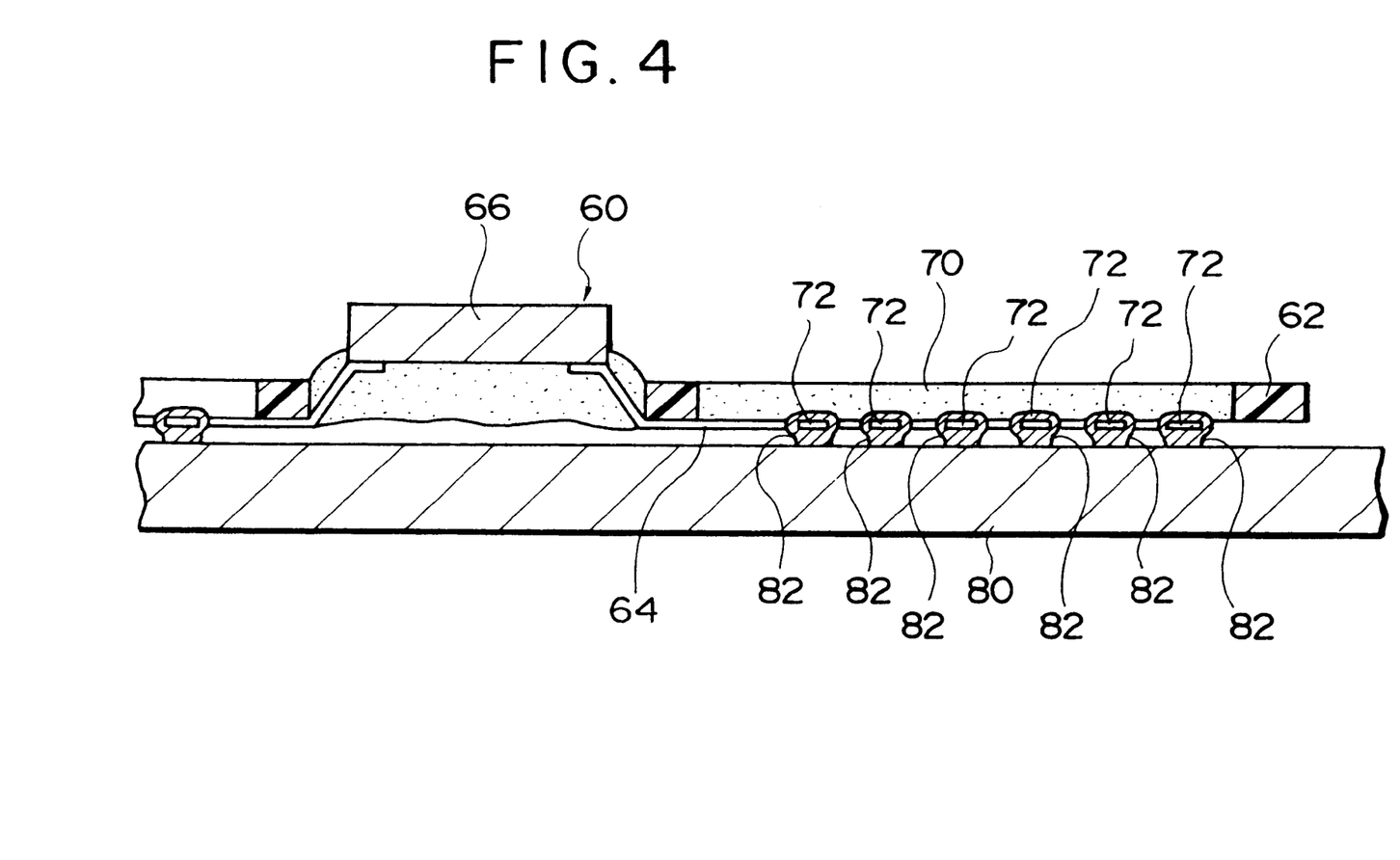
FIG. 4 shows a circuit board on which the semiconductor device of the first embodiment is mounted.

Next, FIG. 4 shows a circuit board on which is mounted the semiconductor device of the first embodiment. As shown in this figure, the connection portions 72 of the semiconductor device 60 are bonded to portions for connection 82 of a circuit board 80. The portions for connection 82 are pads forming part of the conduction pattern formed on the circuit board 80.

The insulating film 62 shown in FIG. 4 may, for the purposes of preventing bending, be provided with a flat carrier plate. In this case, however, the location of provision of the carrier plate is on the side from which the semiconductor chip 66 projects, that is, on the side of the insulating film which is opposite to the surface on which the wiring pattern 64 is formed. It is also such that the wiring pattern 64 is not covered.

Figure 5:
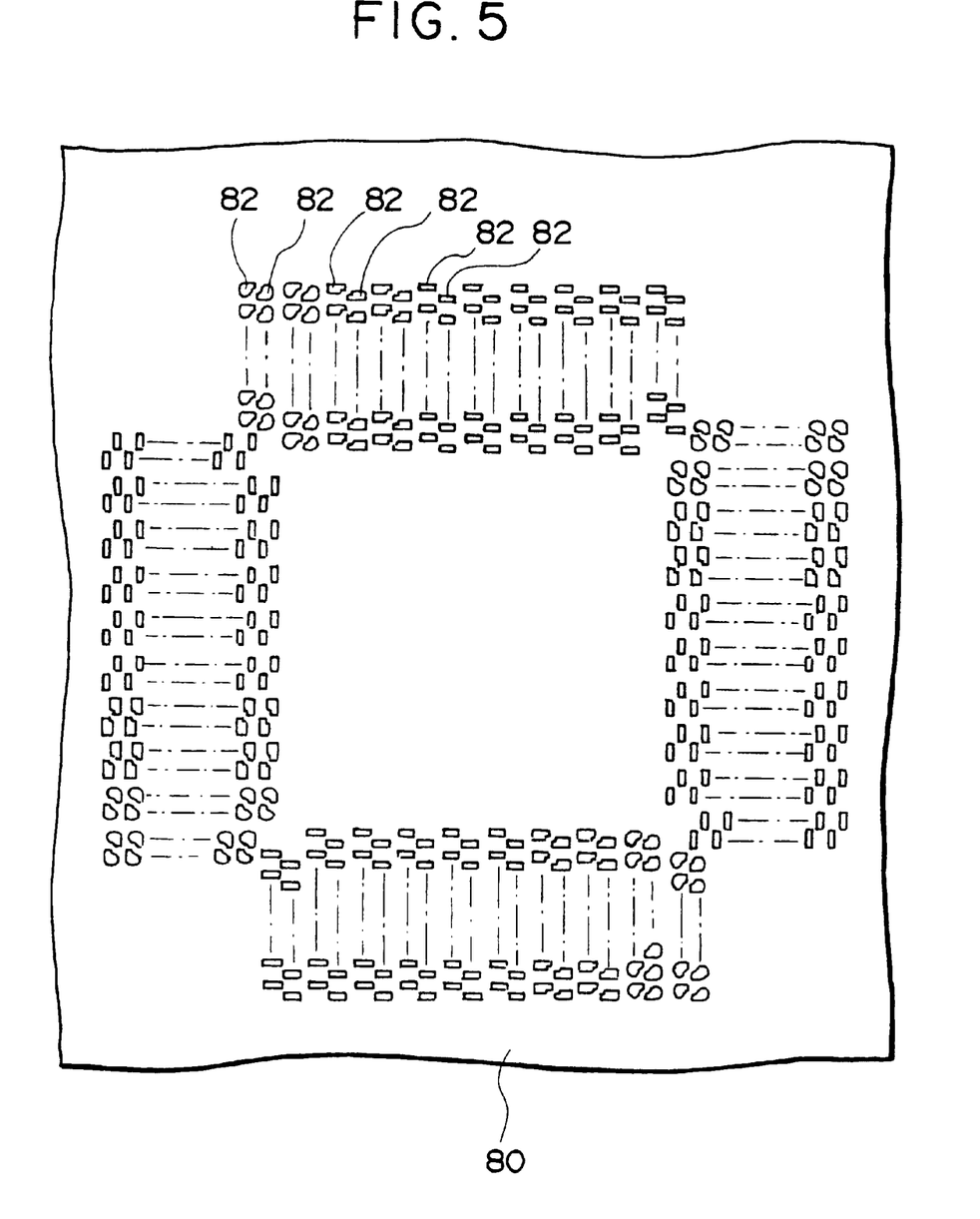
FIG. 5 shows the form and layout of portions of a circuit board to which connections are made, for the purpose of mounting the semiconductor device of the first embodiment.

FIG. 5 shows the form and layout of portions of a circuit board to which connections are made, for the purpose of mounting the semiconductor device of the first embodiment. It should be noted that in this figure the so-called wiring for the purpose of connecting the semiconductor device to the outside is omitted, The portions for connection 82 are formed by solder printing and are arranged in a zigzag pattern, corresponding to the layout of the above-mentioned-connection portions 72. In more detail, as shown in FIG. 3B, the connection portions 72 are exposed from each of the opposing long edges of each opening 70, and the portions for connection 82 are arranged as a corresponding set in two rows. Moreover, opposing connection portions 72 are arranged in a staggered fashion, and are thus overall in a zigzag pattern, as a result of which the portions for connection 82 also are arranged in a staggered fashion, in a zigzag pattern. It should be noted that in FIG. 5 a variety of forms for the portions for connection 82 are shown, but the portions for connection 82 may be formed by any one of these forms alone.

Moreover, since the portions for connection 82 are formed from solder, solder is not required for the connection portions 72.

This embodiment is configured as thus described above, and now a method of manufacturing the same is described.

The method of manufacture of the semiconductor device 60 shown in FIG. 1 includes steps of forming the wiring pattern 64 on one surface of the insulating film 62, forming a device hole (first opening) 62a in the insulating film 62, and using the device hole 62a to install the semiconductor chip 66. The semiconductor chip 66 is disposed so as to project from the surface of the insulating film 62 opposite to the surface on which the wiring pattern 64 is formed, and moreover is disposed with its active surface 66a facing in the direction of the device hole 62a of the insulating film 62. The extremity of the wiring pattern 64 projects into the device hole 62a, is bent in the direction of the surface opposite to that on which it is formed, and is connected to the semiconductor chip 66. The semiconductor chip 66 and insulating film 62 are sealed by potting with an epoxy resin 68.

The semiconductor device 60 has the plurality of openings 70 formed in the insulating film 62, and connection portions 72 provided from the wiring pattern 64 are characterized by being exposed by the openings 70. The openings 70 and connection portions 72 are constructed to facilitate bonding to a circuit board.

Again, the semiconductor chip 66, while facing upward in FIG. 1 (reverse TAB), is not restricted to this, and the semiconductor chip may equally be mounted in the reverse orientation (face-down) (so-called front TAB). In other words, the semiconductor chip may be positioned on the surface of bump formation. In this case, since it is possible for the reverse surface of the semiconductor chip to contact the motherboard, by connecting the semiconductor chip to the motherboard with for example silver paste or similar thermally conducting adhesive, the heat dissipation of the semiconductor chip can be improved. Further, according to the thickness of the semiconductor element, since a fixed height can be obtained between the insulating film and the motherboard, short circuits between for example adjacent solder bumps can be avoided.

The film carrier tape 74 shown in FIG. 2 includes a step of forming the sprocket holes 74a and the device hole 74b being a first opening, and a step of forming within the openings 70 the provisional wiring pattern 76. As part of this provisional wiring pattern 76 is formed the link portion 76b to extend across the opening 70, and each of the connection portions 72 (wiring pattern 64) is formed in a state integral with the link portion 76b passing across in this way. It should be noted that the each of the connections between connection portions 72 and the link portion 76b is connected in a position such that the distance is short. Since all of the connection portions 72 are electrically connected, after electroplating processing, separation is carried out at prescribed locations, to form the above-mentioned wiring pattern 64.

From the provisional wiring pattern 76 thus formed, by cutting away the link portion 76b, as shown in FIG. 3B, a construction is obtained in which the connection portions 72 project from the openings 70.

It should be noted that the projections 76a project from pad portions 78 of greater area than other wiring. Specifically, pad portions 78 of greater extent than other wiring are provided, and the projections 76a extend from these pad portions 78. By the provision of the pad portions 78 of greater extent, after the link portion 76b is cut away, the pad portions 78 can be reached with a probe, and testing carried out.

To the film carrier tape 74 processed in this way, the semiconductor chip 66 is attached, prescribed locations of the film carrier tape 74 are cut away, and the semiconductor device 60 of FIG. 1 is obtained.

Figure 6A:
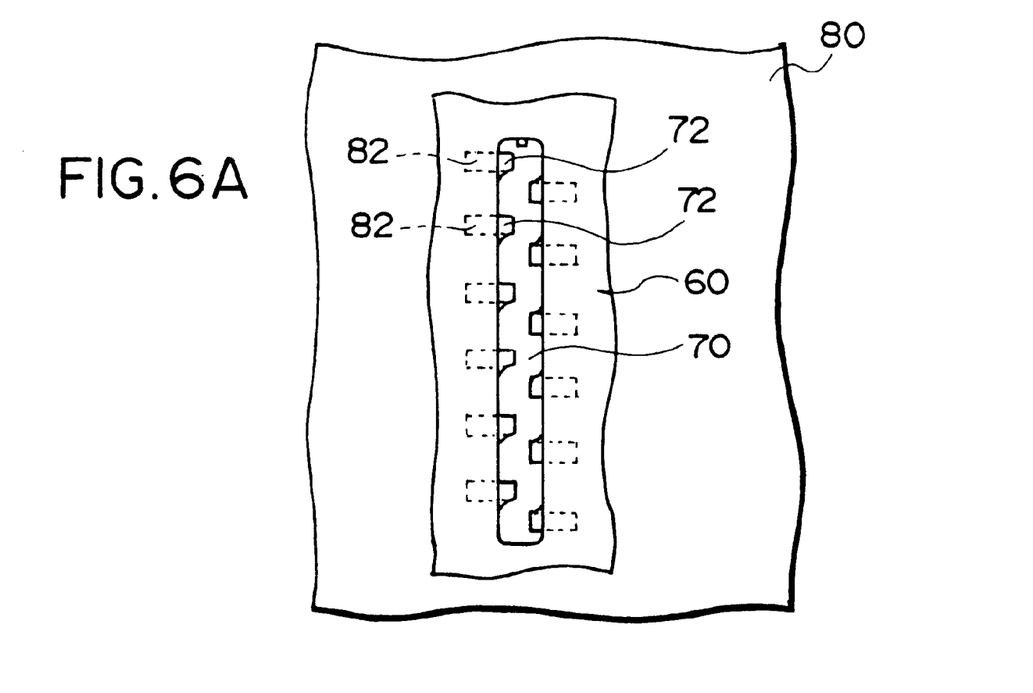
FIGS. 6A and 6B show stages in the process of mounting the semiconductor device of the first embodiment on a circuit board.
Figure 6B:
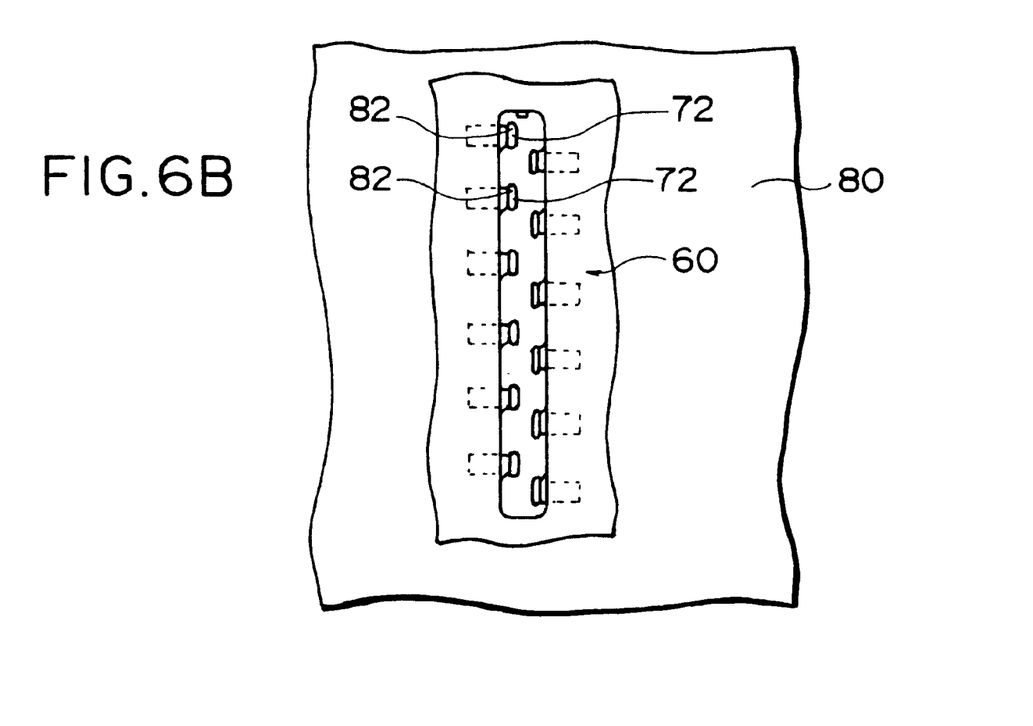

Next, FIGS. 6A and 6B show stages in the process of mounting the semiconductor device of the first embodiment on a circuit board. In more detail, FIGS. 6A and 6B show regions corresponding to FIG. 3B, that is to say, the surroundings of the connection portions 72. Referring to this figure, the process of mounting the semiconductor device 60 on the circuit board 80 having the portions for connection 82 is now described.

First, as shown in FIG. 6A, the semiconductor device 60 is placed in position on the circuit board 80. In more detail, positioning is carried out so that the portions for connection 82 and the connection portions 72 are aligned. Then, as described above, since there is solder printed on the lands of the portions for connection 82, by carrying out reflow in this state, as shown in FIG. 6B, the portions for connection 82 fuse, so as to surround the peripheral surface of the connection portions 72. In this way, as shown in FIG. 5, the connection portions 72 and portions for connection 82 are connected.

According to this embodiment, since bonding is carried out within the openings 70, a check of the connection state, repairs, and electrical testing can be carried out easily. Again, since it is possible for the solder used in bonding when melted to swell up within the openings 70, the tendency to spread sideways is avoided, and short-circuit contacts between adjacent connection portions 72 do not occur. In addition, since in this embodiment the connection portions 72 are disposed in a zigzag pattern, the gap between opposing connection portions 72 is large, and from this point of view also, contacts between adjacent connection portions 72 are prevented.

It should be noted that for the bonding of the semiconductor element, it is also possible to use the so-called B-TAB type in which projections are formed integrally on the side of the wiring pattern.

Second Embodiment

Figure 7A:
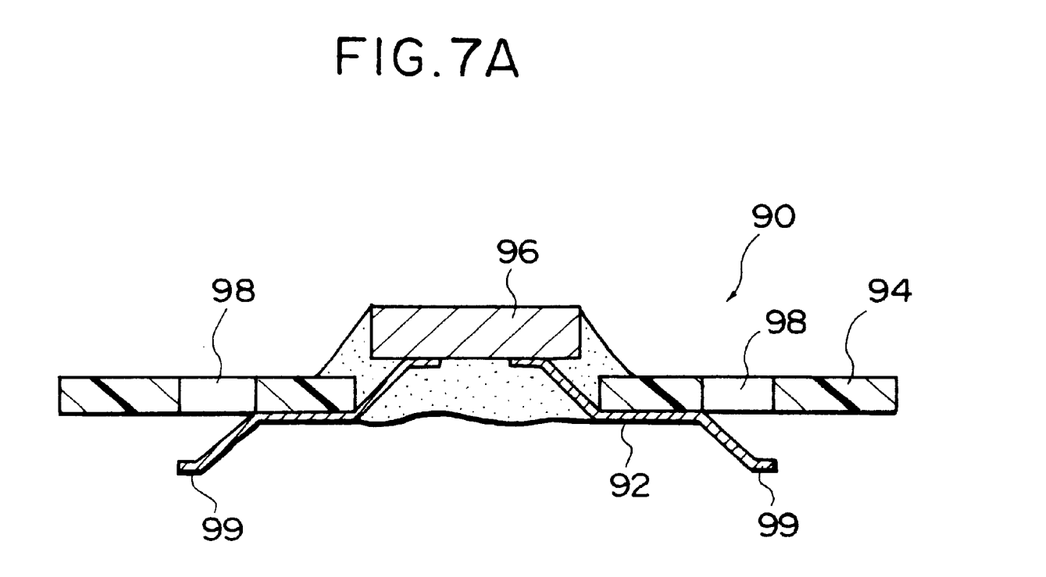
FIGS. 7A and 7B show a second embodiment of a semiconductor device.
Figure 7B:
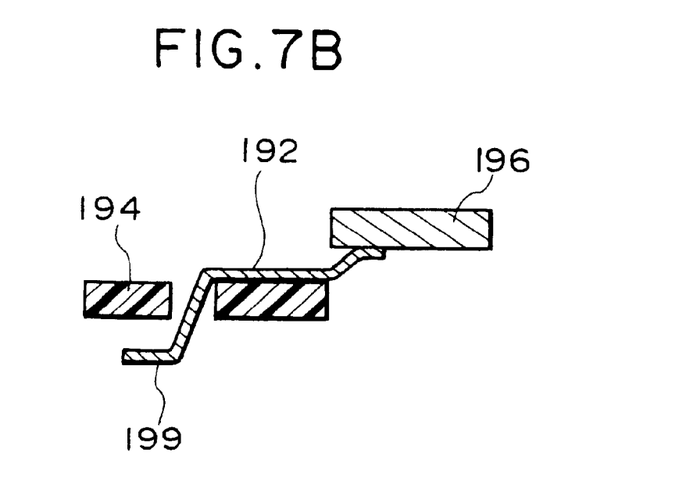

FIG. 7 shows a second embodiment of a semiconductor device. The semiconductor device 90 shown in this figure has a variant form of the connection portions 72 of the semiconductor device 60 shown in FIG. 1.

Insofar as the semiconductor device 90 has an insulating film 94 with a wiring pattern 92 and a semiconductor chip 96, and an opening 98 is formed in the insulating film 94, it is the same as the semiconductor device 60. However, it differs from the semiconductor device 60 in that a part of the wiring pattern 92 is bent in a direction away from the insulating film 94, and connection portions 99 are formed.

In this way, the connection portions 99 replace the bumps, and mounting is facilitated. Here, since the wiring pattern 92 is extremely thin, preferably a part of the wiring pattern 92 is bent to form the connection portions 99 immediately before connection to the board on which mounting is taking place, and the mounting is then carried out immediately.

It should be noted that for the bonding of the semiconductor element, it is also possible to use the so-called B-TAB type in which projections are formed integrally on the side of the wiring pattern.

What is claimed is:

1. A semiconductor device, comprising:

a semiconductor element;

an insulating film having a first opening and a plurality of second openings, at least part of said semiconductor element positioned in said first opening when said semiconductor element is disposed on said insulating film, said second openings provided aligned around said first opening, each of said second openings having a pair of long edges in an approximately quadrilateral shape, said long edges positioned at right angles to the closest one of edges defining said first opening; and a wiring pattern formed on a surface of said insulating film and connected to said semiconductor element, said wiring pattern having a plurality of connection portions at its extremity, ones of said connection portions positioned in each of said second openings, said ones of said connection portions disposed in a staggered fashion facing toward a center of each of said second openings from said long edges of each of said second openings.

2. The semiconductor device of claim 1, wherein said extremity of said wiring pattern is bent in a direction away from said insulating film, each of said connection portions positioned separated from said insulating film within each of said second openings.

3. A flexible substrate, comprising:

an insulating film having a first opening and a plurality of second openings, said second openings provided aligned around said first opening, each of said second openings having a pair of long edges in an approximately quadrilateral shape, said long edges positioned at right angles to the closest one of edges defining said first opening, at least part of a semiconductor element positioned in said first opening when said semiconductor element is disposed on said insulating film; and a wiring pattern formed on a surface of said insulating film, said wiring pattern having a plurality of connection portions at its extremity, ones of said connection portions positioned in each of said second openings, said ones of said connection portions disposed in a staggered fashion facing toward a center of each of said second openings from said long edges of each of said second openings.

4. The flexible substrate of claim 3, wherein a pair of said connection portions mutually opposed in one of said second openings are provided in a position symmetrical with respect to a phantom line parallel to a shorter edge of each of said second openings.

5. The flexible substrate of claim 3, wherein each of said connection portions becomes narrower in a direction toward the center of each of said second openings from said surface of said insulating film.

6. The flexible substrate of claim 3, wherein said wiring pattern is formed close to said second openings, having a test pad connected to one of said connection portions.

7. The flexible substrate of claim 3, wherein the length of each of said long edges of said second openings is determined according to their positions for avoiding said wiring pattern.

8. The flexible substrate of claim 7, wherein said long edges of said second openings become shorter along a direction of their dispositions from a center to extremities of said dispositions, said long edges becoming shorter at a side of said first opening.

9. The flexible substrate of claim 3, wherein a shorter edge of each of said second openings is shorter than a spacing between adjacent ones of said second openings.

10. The flexible substrate of claim 3, further comprising a link portion within each of said second openings, said link portion electrically connecting every one of said connecting portions in each of said second openings.

11. A circuit board, comprising:

said semiconductor device of claim 1, said semiconductor device having said connection portions; and a substrate having a conducting pattern thereon, said connection portions of said semiconductor device connected to said conducting pattern.

12. A method of making a semiconductor device, comprising:

forming a first opening and a plurality of second openings in an insulating film, said second openings provided aligned around said first opening, each of said second openings having a pair of long edges in an approximately quadrilateral shape, said long edges positioned at right angles to the closest one of edges defining said first opening;

forming a wiring pattern on a surface of said insulating film, said wiring pattern having a plurality of connection portions at its extremity, ones of said connection portions positioned in each of said second openings, said ones of said connection portions disposed in a staggered fashion facing toward a center of each of said second openings from said long edges of each of said second openings; and providing a semiconductor element on said insulating film and connecting said semiconductor element to said wiring pattern, at least part of said semiconductor element positioned in said first opening.

13. A method of making a flexible substrate, comprising:

forming a first opening and a plurality of second openings in an insulating film, said second openings provided aligned around said first opening, each of said second openings having a pair of long edges in an approximately quadrilateral shape, said long edges positioned at right angles to the closest one of edges defining said first opening, at least part of a semiconductor element positioned in said first opening when said semiconductor element is disposed on said insulating film; and forming a wiring pattern on a surface of said insulating film, said wiring pattern having a plurality of connection portions at its extremity, ones of said connection portions positioned in each of said second openings, said ones of said connection portions disposed in a staggered fashion facing toward a center of each of said second openings from said long edges of each of said second openings.

14. The method of making a flexible substrate of claim 13, further comprising:

forming a link portion within each of said second openings, said link portion electrically connecting said ones of said connecting portions in each of said second openings; and then cutting off said link portion to form each of said connecting portions.

15. A method of mounting said semiconductor device of claim 1, comprising:

forming a conducting pattern on a circuit board;

providing solder on said conducting pattern; and connecting said connection portions of said semiconductor device to said conducting pattern by means of said solder provided on said conducting pattern.

* * * * *